United States Patent
Ziazadeh et al.

(10) Patent No.: US 7,224,189 B1
(45) Date of Patent: May 29, 2007

(54) AC/DC COUPLING INPUT NETWORK WITH LOW-POWER COMMON-MODE CORRECTION FOR CURRENT-MODE-LOGIC DRIVERS

(75) Inventors: Ramsin M. Ziazadeh, San Jose, CA (US); Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 123 days.

(21) Appl. No.: 11/036,744

(22) Filed: Jan. 14, 2005

(51) Int. Cl.
*H03K 19/0175* (2006.01)

(52) U.S. Cl. .......................... 326/86; 326/90; 326/127

(58) Field of Classification Search ............... 326/30, 326/86, 90, 115, 126–127
See application file for complete search history.

(56) References Cited

U.S. PATENT DOCUMENTS 6,429,678 B1 * 8/2002 Wong et al. .................. 326/30
6,654,462 B1 * 11/2003 Hedberg ................ 379/399.01

* cited by examiner

*Primary Examiner*—Anh Q. Tran

(57) ABSTRACT

An input network is provided within an integrated circuit for interfacing with signals produced by an external CML driver apparatus. The input network includes an input for receiving the signals, and this input is coupled to a terminating impedance, a DC attenuator and an AC attenuator. A common-mode correction loop is coupled to the AC attenuator and the DC attenuator for rejecting common-mode noise generated by the CML driver apparatus. The common-mode correction loop can also provide a common-mode voltage suitable for facilitating high-speed operation of low-voltage devices in the internal data path of the integrated circuit. An amplifier can be provided to compensate for signal attenuation in the input network.

20 Claims, 1 Drawing Sheet

AC/DC COUPLING INPUT NETWORK WITH LOW-POWER COMMON-MODE CORRECTION FOR CURRENT-MODE-LOGIC DRIVERS

TECHNICAL FIELD OF THE INVENTION

The present invention is generally directed to interfaces between integrated circuits and, more particularly, to on-chip input networks that receive off-chip signals from current-mode-logic (CML) drivers.

BACKGROUND OF THE INVENTION

In today's high-speed communication channels, many chip-to-chip interfaces utilize CML drivers. The CML drivers of one chip drive outgoing communication signals to another chip. CML drivers typically use an NMOS differential pair that steers a differential current to a single or double terminated differential resistance, such as a 50 ohm termination resistance connected to the power supply. In order to interface between chips which may utilize different power supply voltages and/or different process technologies, it is desirable to AC couple the CML drivers of the sending chip to the input of the receiving chip. AC coupling may also permit the designer to take advantage of high-speed process technology (low-voltage devices) that may not otherwise interface with the CML drivers.

However, the use of AC coupling presents various design challenges. For example, the addition of off-chip bypass capacitors leads to undesirable parasitics. On the other hand, the relatively large amount of capacitance required makes it difficult to integrate the capacitors on the chip.

Another difficulty associated with the use of CML drivers is the common-mode noise generated by CML drivers.

It is desirable in view of the foregoing to provide for chip-to-chip interfacing using CML drivers and AC coupling between chips, while avoiding the aforementioned capacitor design and common-mode noise difficulties.

SUMMARY OF THE INVENTION

To address the above-discussed deficiencies of the prior art, it is a primary object of the present invention to provide, for use in an integrated circuit, an input network for interfacing with signals produced by an external CML driver apparatus. In some embodiments the input network includes an input for receiving the signals, which input is coupled to a terminating impedance, a DC attenuator and an AC attenuator. Also provided is a common-mode correction loop coupled to the AC attenuator and the DC attenuator. The common-mode correction loop rejects common-mode noise generated by the CML driver apparatus, and can also provide a common-mode voltage that is suitable for facilitating high-speed operation of low-voltage devices in the internal data path.

Some embodiments include an amplifier which compensates for signal attenuation in the input network.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
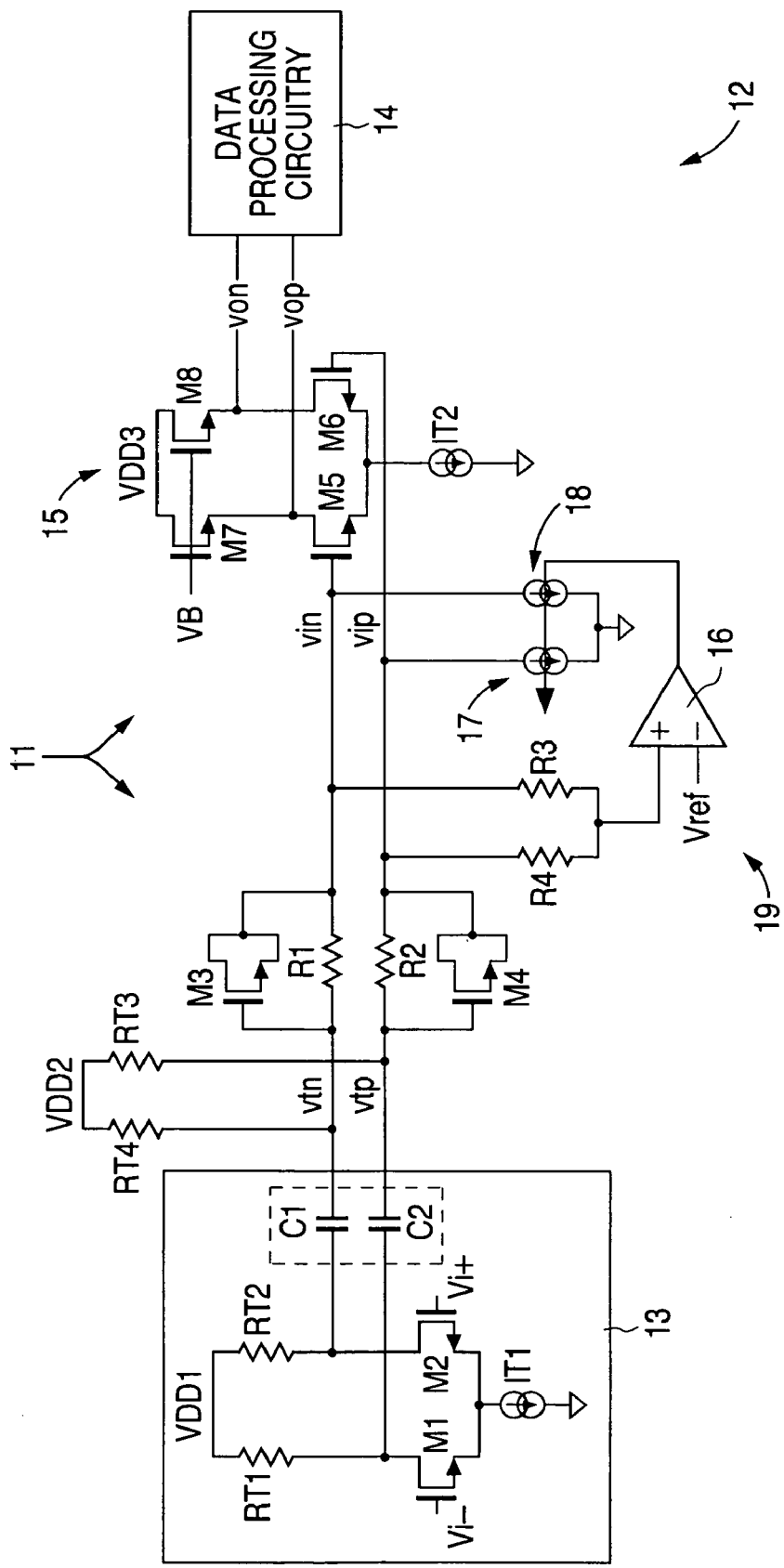
FIG. 1 illustrates exemplary embodiments of an on-chip input network according to the invention for interfacing with signals produced by an off-chip CML driver apparatus.

FIG. 1 discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged chip-to-chip interface.

Exemplary embodiments of the invention provide an AC/DC coupling input network for CML type applications. The input network also interfaces with external incompatible power supply voltages. A low-power common-mode correction loop rejects common-mode noise, and can also provide a common-mode voltage suitable for facilitating high-speed operation of low-voltage transistors in the internal data path. This is accomplished without bandwidth degradation.

FIG. 1 diagrammatically illustrates exemplary embodiments of an AC/DC coupling input network 11 according to the invention. The input network 11 is provided in an integrated circuit 12 together with data processing circuitry 14. The integrated circuit 12 is coupled to an off-chip CML driver apparatus 13. The CML driver apparatus 13 is typically provided in another integrated circuit. The CML driver apparatus 13 can be AC coupled to the integrated circuit 12 via capacitors C1 and C2, or can be DC coupled by omitting capacitors C1 and C2 as shown by broken line in FIG. 1. The NMOS differential pair M1,M2 steers differential current to terminating resistors RT1 and RT2 connected to the drains of M1 and M2, respectively. The terminating resistors RT1 and RT2 are also connected to the power supply VDD1. A current source IT1 is connected between ground and the sources of M1 and M2. The current steering operation is performed in response to the input voltages Vi+(M2) and Vi−(M1). The CML driver apparatus 13 illustrated in FIG. 1 is merely one example of a CML driver apparatus with which the input network 11 is cooperable. Each of the termination resistors RT1 and RT2 is typically centered at around 50 ohms.

The input network 11 receives from the CML driver apparatus 13 input signals vtn and vtp. The signals vtn and vtp are respectively terminated by terminating resistors RT4 and RT3, for example 50 ohm resistors connected to power supply VDD2. Although a double termination impedance is illustrated in the input network 11 of FIG. 1, other embodiments can utilize a single termination impedance, as is well known in the art.

The input network 11 includes a DC attenuation network comprising resistors R1, R2, R3 and R4. Resistors R1 and R2 are connected to the inputs vtn and vtp, respectively, and the opposite ends of resistors R1 and R2 are connected to R3 and R4, respectively. The junction of resistors R1 and R3 is connected to the input vin of a limiting amplifier 15, and the junction of resistors R2 and R4 is connected to the input vip of the limiting amplifier 15. The other ends of resistors R3 and R4 are connected to the non-inverting input of an amplifier 16 operating as a voltage comparator. The inverting input of the amplifier 16 is connected to a reference voltage Vref. The output of the amplifier 16 is provided as a control input to a pair of current sources 17 and 18. The current source 17 is connected between the limiting amplifier input vip and ground, and the current source 18 is connected between the limiting amplifier input vin and ground. Resistors R3 and R4, the amplifier 16, and the current sources 17 and 18, taken together, constitute a common-mode correction loop 19.

The input network 11 also includes an AC attenuator comprising transistors M3 and M4 acting as coupling capacitors. The gates of transistors M3 and M4 are connected to the inputs vtn and vtp, respectively, the drain and source of transistor M3 are connected to the junction of resistors R1 and R3, and the drain and source of transistor M4 are connected to the junction of resistors R2 and R4.

The gain of the DC attenuator is given by $$\text{Gain}(DC\ atten) = R3/(R1+R3)\ or\ R4/(R2+R4) \quad (1)$$

The gain of the AC attenuator is given by $$\text{Gain}(AC\ atten.) = C\_M3/(C\_M3+C\_M5)\ or\ C\_M4/(C\_M4+C\_M6), \quad (2)$$

wherein the notation "C_Mx" refers to the capacitance seen at the gate of transistor Mx.

In order to achieve a constant gain over the entire frequency spectrum, some embodiments set the gain of the DC attenuator equal (or as close as possible) to the gain of the AC attenuator.

The pole frequency of the input network can be written as $$\text{Pole} = 1/[R1\|R3*(C\_M5+C\_M3)], \text{ or } 1/[R2\|R4*(C\_M6+C\_M4)]. \quad (3)$$

The zero frequency of the input network 11 can be written as $$\text{Zero} + 1/(R1*C\_M3)\ or\ 1/(R2*C\_M4) \quad (4)$$

Some embodiments insure that the pole and zero frequencies are at relatively low frequencies, typically less than or equal to the lowest frequency of operation (e.g., maximum run-length of 8 b/10 b coding).

The aforementioned common-mode correction loop 19 controls the common-mode input voltage to the limiting amplifier 15. This is accomplished by sensing the common-mode voltage generated at the junction of resistors R3 and R4. The amplifier 16 compares this common-mode voltage to the reference voltage Vref, for example, an internally generated reference voltage. The amplifier output provides the proper biasing to the current sources 17 and 18. The current source 18 sinks current through resistors R1 and RT4, and the current source 17 sinks current through resistors R2 and RT3. In response to the biasing signal provided by the amplifier 16, the current sources 17 and 18 sink the appropriate amount of current to provide the desired voltage levels at vin and vip. In some embodiments, R1 is significantly larger than RT4, and R2 is significantly larger than RT3, so minimal DC current is required to correct for the common-mode voltage, thereby minimizing the power consumption of the common-mode correction loop 19.

In some exemplary embodiments, the resistors R1, R2, R3 and R4 of the DC attenuation network are polysilicon resistors. In some embodiments, the capacitance transistors M3 and M4 are matched in layout so that they track with each other over process, voltage and temperature variations. It is therefore possible to achieve a good pole-zero cancellation over process, voltage and temperature variations.

The limiting amplifier 15 can compensate for gain loss in the input network 11. The limiting amplifier 15 includes a first transistor pair M5,M7 and a second transistor pair M6,M8. The gates of transistors M5 and M6 are respectively connected to the limiting amplifier inputs vin and vip. The sources of transistors M5 and M6 are connected together, and a current source IT2 is connected between the sources and ground. The drains of transistors M5 and M6 are respectively connected to the sources of transistors M7 and M8, and these two drain-source connections define the outputs von and vop of the limiting amplifier 15, which outputs are provided as inputs to the data processing circuitry 14. The drains of transistors M7 and M8 are connected to power supply voltage VDD3, and the gates of transistors M7 and M8 are connected to a biasing voltage VB. In some embodiments, transistors M7 and M8 are designed to track with transistors M5 and M6, respectively, in voltage, process and temperature variations. In order to compensate for attenuation and achieve a unity DC gain, and to maintain the gain over the entire frequency range, some embodiments set the transconductance ratio Gm5/Gm7 of transistor pair M5,M7, and the transconductance ratio Gm6/Gm8 of transistor pair M6,M8 as follows $$Gm5/Gm7 = R3/(R1+R3) = C\_M3/(C\_M3+C\_M5) \quad (5)$$

$$Gm6/Gm8 = R4/(R2+R4) = C\_M4/(C\_M4+C\_M6) \quad (6)$$

In order to provide a flat frequency response, some embodiments make the resistors R1 and R2, and the coupling capacitors M3 and M4, as large as possible, while minimizing the load capacitance of the limiting amplifier 16, which is equivalent to the gate capacitance of the transistors M5 and M6.

Some exemplary embodiments have the following resistance values: R1=twelve thousand ohms (12 kΩ), R2=twelve thousand ohms (12 kΩ), R3=eighteen thousand ohms (18 kΩ), and R4=eighteen thousand ohms (18 kΩ).

As described above, an on-chip input network according to exemplary embodiments of the invention can operate with AC or DC coupled inputs. A common-mode correction loop rejects common-mode noise generated by external CML drivers. The common-mode correction loop can also provide a proper common-mode voltage, so that the internal data processing circuitry, especially high-speed, low-voltage devices can operate adequately at high data rates. Signal integrity for the internal data processing circuitry is ensured, without any limitation on bandwidth.

Although the present invention has been described with an exemplary embodiment, various changes and modifications may be suggested to one skilled in the art. It is intended that the present invention encompass such changes and modifications as fall within the scope of the appended claims.

What is claimed is:

1. For use in an integrated circuit, an input network for interfacing with signals produced by a current-mode-logic driver apparatus located externally of the integrated circuit, comprising:
   an input for receiving the signals;
   a terminating impedance coupled to said input and to a power source;
   a DC attenuator coupled to said input;
   an AC attenuator coupled to said input; and
   a common-mode correction loop coupled to said AC attenuator and said DC attenuator for rejecting common-mode noise generated in the signals by the current-mode-logic driver apparatus, wherein said common-mode correction loop draws current from said power source.

2. The input network of claim 1, wherein said terminating impedance includes a termination resistance, and wherein said DC attenuator includes first and second resistors which have respective resistances that are significantly greater than said termination resistance.

3. The input network of claim 1, wherein said AC attenuator includes first and second transistors which respectively operate as first and second coupling capacitors.

4. The input network of claim 3, wherein said DC attenuator includes first and second resistors respectively coupled in parallel with said first and second coupling capacitors.

5. The input network of claim 1, wherein said common-mode correction loop includes first and second resistors and a voltage comparator having an input coupled to said first and second resistors, said voltage comparator having another input for connection to a reference voltage.

6. The input network of claim 5, wherein said common-mode correction loop includes a current source apparatus having a control input coupled to an output of said voltage comparator.

7. The input network of claim 6, wherein said DC attenuator includes third and fourth resistors respectively coupled to said first and second resistors, said current source apparatus including first and second current paths respectively coupled to said third and fourth resistors for producing respective currents in said third and fourth resistors in response to said control input.

8. The input network of claim 7, wherein said DC attenuator includes said first and second resistors.

9. The input network of claim 7, wherein each of said third and fourth resistors is coupled to said input, said terminating impedance including a termination resistance, and each of said third and fourth resistors having a resistance that is significantly greater than said termination resistance.

10. The input network of claim 1, wherein said DC attenuator includes a plurality of polysilicon resistors.

11. The input network of claim 1, wherein said terminating impedance includes first and second resistors.

12. The input network of claim 1, wherein said DC attenuator has a gain associated therewith that is approximately equal to a gain associated with said AC attenuator.

13. The input network of claim 1, including an amplifier having an input coupled to said AC attenuator and said DC attenuator.

14. The input network of claim 13, wherein said amplifier compensates for signal attenuation in said input network.

15. The input network of claim 13, wherein said amplifier includes first and second pairs of connected transistors, said transistors of each said pair having a transconductance ratio that is determined based on one of a gain associated with said AC attenuator and a gain associated with said DC attenuator.

16. The input network of claim 15, wherein each of said transconductance ratios is approximately equal to said one of said gain associated with said AC attenuator and said gain associated with said DC attenuator.

17. The input network of claim 1, wherein said common-mode correction loop is further for providing a common-mode voltage which permits data processing circuitry in the integrated circuit to operate at a desired data rate.

18. An integrated circuit, comprising:
    data processing circuitry;
    an input network coupled to said data processing circuitry for interfacing said data processing circuitry with signals produced by a current-mode-logic driver apparatus located externally of said integrated circuit, said input network comprising an input for receiving the signals, a terminating impedance coupled to said input and to a power source, a DC attenuator coupled to said input, an AC attenuator coupled to said input, and a common-mode correction loop coupled to said AC attenuator and said DC attenuator for rejecting common-mode noise generated in the signals by the current-mode-logic driver apparatus, wherein said common-mode correction loop draws current from said power source.

19. The integrated circuit of claim 18, including an amplifier having an input coupled to said AC attenuator and said DC attenuator, said amplifier having an output coupled to an input of said data processing circuitry, and wherein said amplifier compensates for signal attenuation in said input network.

20. For use in an integrated circuit, a method of interfacing data processing circuitry with signals produced by a current-mode-logic driver apparatus located externally of the integrated circuit, comprising:
    terminating the signals with an impedance coupled to a power source;
    applying DC attenuation to the signals;
    applying AC attenuation to the signals;
    rejecting common-mode noise generated in the signals by the current-mode-logic driver apparatus with a common-mode correction loop, wherein the common-mode correction loop draws current from said power source.

* * * * *